US007225380B2

(12) United States Patent
Toriumi

(10) Patent No.: US 7,225,380 B2
(45) Date of Patent: May 29, 2007

(54) AUDIO DECODER AND AUDIO DECODING METHOD

(75) Inventor: Go Toriumi, Tokyo (JP)

(73) Assignee: NEC Corporation, Tokyo (JP)

( * ) Notice: Subject to any disclaimer, the term of this patent is extended or adjusted under 35 U.S.C. 154(b) by 537 days.

(21) Appl. No.: 10/860,160

(22) Filed: Jun. 4, 2004

(65) Prior Publication Data

US 2004/0250195 A1 Dec. 9, 2004

(30) Foreign Application Priority Data

Jun. 5, 2003 (JP) ............................ 2003-160903

(51) Int. Cl.
*G06F 11/00* (2006.01)
*H03M 13/00* (2006.01)

(52) U.S. Cl. ...................................... 714/746; 714/776

(58) Field of Classification Search ................ 714/746, 714/752, 776
See application file for complete search history.

(56) References Cited

U.S. PATENT DOCUMENTS

| | | | | |
|---|---|---|---|---|
| 5,907,822 | A | 5/1999 | Prieto | |
| 5,918,205 | A * | 6/1999 | Dierke | 704/230 |
| 6,687,670 | B2 | 2/2004 | Sydanmaa et al. | |

FOREIGN PATENT DOCUMENTS

| | | |
|---|---|---|
| JP | 2001-501063 | 1/2001 |
| JP | 2001-339368 | 12/2001 |
| JP | 2002-073091 | 3/2002 |
| JP | 2002-135786 | 5/2002 |
| WO | WO 99/66494 | 12/1999 |
| WO | WO 01/33788 A1 | 5/2001 |

OTHER PUBLICATIONS

Ko et al., A VLSI implementation of dual Ac-3 and MPEG-2 Audio decoder, 1998, IEEE, p. 326-327.*

* cited by examiner

*Primary Examiner*—Shelly Chase
(74) *Attorney, Agent, or Firm*—Foley & Lardner LLP

(57) ABSTRACT

The decoder for decoding the encoded audio data comprises an error detection device for detecting errors of encoded audio data; an error concealing method determining device for determining an audio frame and weight of window function which are used for concealing the errors based on error information detected by the error detection device; a frequency-to-time converter for converting audio data of frequency components to time-component audio frame; an audio frame buffer for accumulating the time-component audio frame outputted by the frequency-to-time converter; and a windowing processing device for adding weight onto the time-component audio frame outputted by the frequency-to-time converter and/or the audio frame accumulated in the audio frame buffer according to the weight of window function determined by the error concealing method determining device.

20 Claims, 11 Drawing Sheets

AUDIO DECODER AND AUDIO DECODING METHOD

BACKGROUND OF THE INVENTION

1. Field of the Invention

The present invention relates to an audio decoder and an audio decoding method for obtaining audio data by decoding encoded audio data. Specifically, it relates to an audio decoder and an audio decoding method which achieves to improve the sound quality at the time of error occurrence when encoded audio data is decoded in a decoding process.

2. Description of the Related Art

In compressed audio data (MP3, AAC, Dolby Digital, ATRAC and the like) which have become popular lately, data is compressed using combination of methods such as entropy encoding, window function, and orthogonal conversion so as to achieve a higher encoding efficiency than that of linear PCM. Such compressed audio data is replayed by being decoded in a decoder, and there are cases of error occurrence in a recording medium or on transmission paths. Especially, frequency of the error occurrence is high in radio transmission and the like. Thus, it becomes necessary to take measures so that errors are hardly perceived. In general, an error detection code such as CRC code is contained in the audio data to be transmitted, which makes it possible to detect the transmission errors.

When errors are detected through the error detection code as described above, conventionally, the detected audio frame is muted or skipped until reaching the audio frame which can be correctly decoded as the measures to cope with the errors. Also, it is possible to employ a method in which sound is smoothly attenuated by inserting zero to input signal of window function so as to reduce the noise (for example, see Japanese Unexamined Patent Publication 2002-073091).

As another method for making errors hardly perceived, often used is a method in which the audio data which is correctly decoded right before is accumulated in a memory and is repeatedly outputted until the data which can be correctly decoded is received.

However, there are shortcomings in the above-described conventional measures for overcoming errors as will be described below.

The first aspect of the shortcomings is as follows. When the adjacent decoded audio data is used for filling to conceal the error of audio data, the sound becomes discontinuous in between the audio frames, which cause the noise.

The second aspect of the shortcomings is as follows. Error concealing processing is performed by using only the error information within the encoded audio data so that there is only a small selection of factors for determining the error concealing method. Thus, it is hard to take sufficient measures for overcoming errors.

The third aspect of the shortcomings is as follows. The error concealing processing is performed by using only the error information of the audio data adjacent to the audio data which is being decoded currently so that it is impossible to take measures for overcoming errors by predicting the future condition.

SUMMARY OF THE INVENTION

A first object of the present invention is to reduce the unpleasant noise by a small operation amount using error concealing processing.

A second object of the present invention is to achieve a better sound quantity at the time of error by increasing the index for taking measures for overcoming errors.

A third object of the present invention is to achieve audio reproduction with a better sound quality through performing a more appropriate error concealing by predicting the state of future error occurrence at the time of errors.

In order to achieve the foregoing objects, the audio decoder of the present invention comprises: an error detection device for detecting errors of encoded audio data; an error concealing method determining device for determining an audio frame and weight of window function which are used for concealing the errors based on error information detected by the error detection device; a frequency-to-time converter for converting audio data of frequency components to time-component audio frame; an audio frame buffer for accumulating the time-component audio frame outputted by the frequency-to-time converter; and a windowing processing device for weighting the time-component audio frame outputted by the frequency-to-time converter and/or the audio frame accumulated in the audio frame buffer according to the weight of window function determined by the error concealing method determining device.

In this configuration, the error detection device detects errors within the audio data and transmits the information to the error concealing method determining device. The audio data of frequency-domain is converted to the time-component audio frame by the frequency-to-time converter and accumulated in the audio frame buffer. Windowing processing is performed on the time-component audio frame and the old audio frames in the audio frame buffer according to the weight determined by the error concealing method determining device. Therefore, reproduced sound (audio frames) with less noise can be obtained.

Further, in order to increase the chances of detecting errors, the audio decoder of the present invention has a configuration in which the error detection device is included in a channel decoder having a function of decoding the data to which transmission-line encoding is performed and a configuration in which the error detection device is included in a demultiplexer having a function of demultiplexing data stream which is obtained by multiplexing audio data.

With this configuration, it is possible to detect and conceal the errors of the encoded audio signals occurred on the transmission paths, and to detect and conceal the errors occurred in the multiplexed data stream.

Also, in order to increase the effect of concealing the errors using the error rate of the past, the audio decoder of the present invention comprises an error history storage for recording the history of error information detected by the error detection device. The error concealing method determining device has a function of determining the weight of window function based on the error information detected by the error detection device and the history of the error information stored in the error history storage.

In the configuration, the error information including the old one is stored in the error history storage and the error concealing method determining device predicts the state of future error occurrence also with consideration of the old error information. By performing the error concealing processing based on the predicted value, it enables to obtain an output with an excellent sound quality.

DETAILED DESCRIPTION OF THE PREFERRED EMBODIMENTS

Next, embodiments of the present invention will be described by referring to accompanying drawings.

First Embodiment

Figure 1:
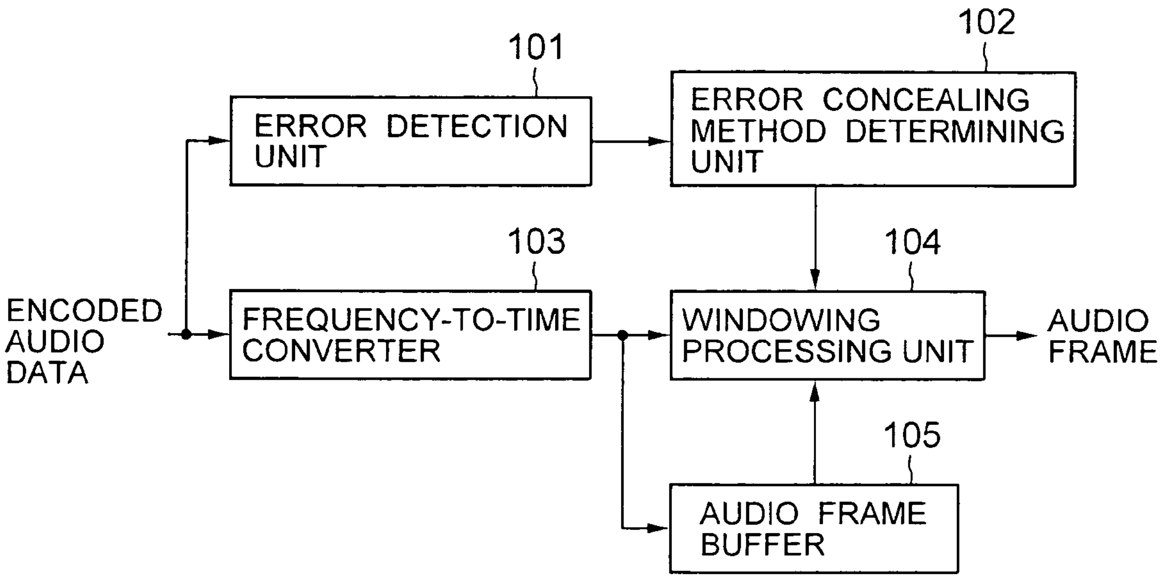
FIG. 1 is a block diagram showing a first embodiment of the present invention.

FIG. 1 is a block diagram showing a first embodiment of the present invention. The embodiment is for avoiding noise due to the generation of discontinued sound when errors are detected in encoded audio data. The embodiment comprises an error detection unit 101, an error concealing method determining unit 102, a frequency-to-time converter 103, a windowing processing unit 104 and an audio frame buffer 105.

The error detection unit 101 has a function of transmitting error information of encoded audio data to the error concealing method determining unit 102. As for the method of detecting errors by the error detection unit 101, any methods may be used. Examples are error inspection by error code such as CRC, grammar check performed on the audio data, underflow inspection of the input buffer of the audio data and the like.

The error concealing method determining unit 102 has a function of determining the audio frame and the weight which are used for windowing operation performed in the windowing processing unit 104 based on the error information of the audio data outputted from the error detection unit 101. As for the specific methods for determining the audio frame and the weight which are used for the windowing operation, for example, the following three methods may be employed.

Figure 2:
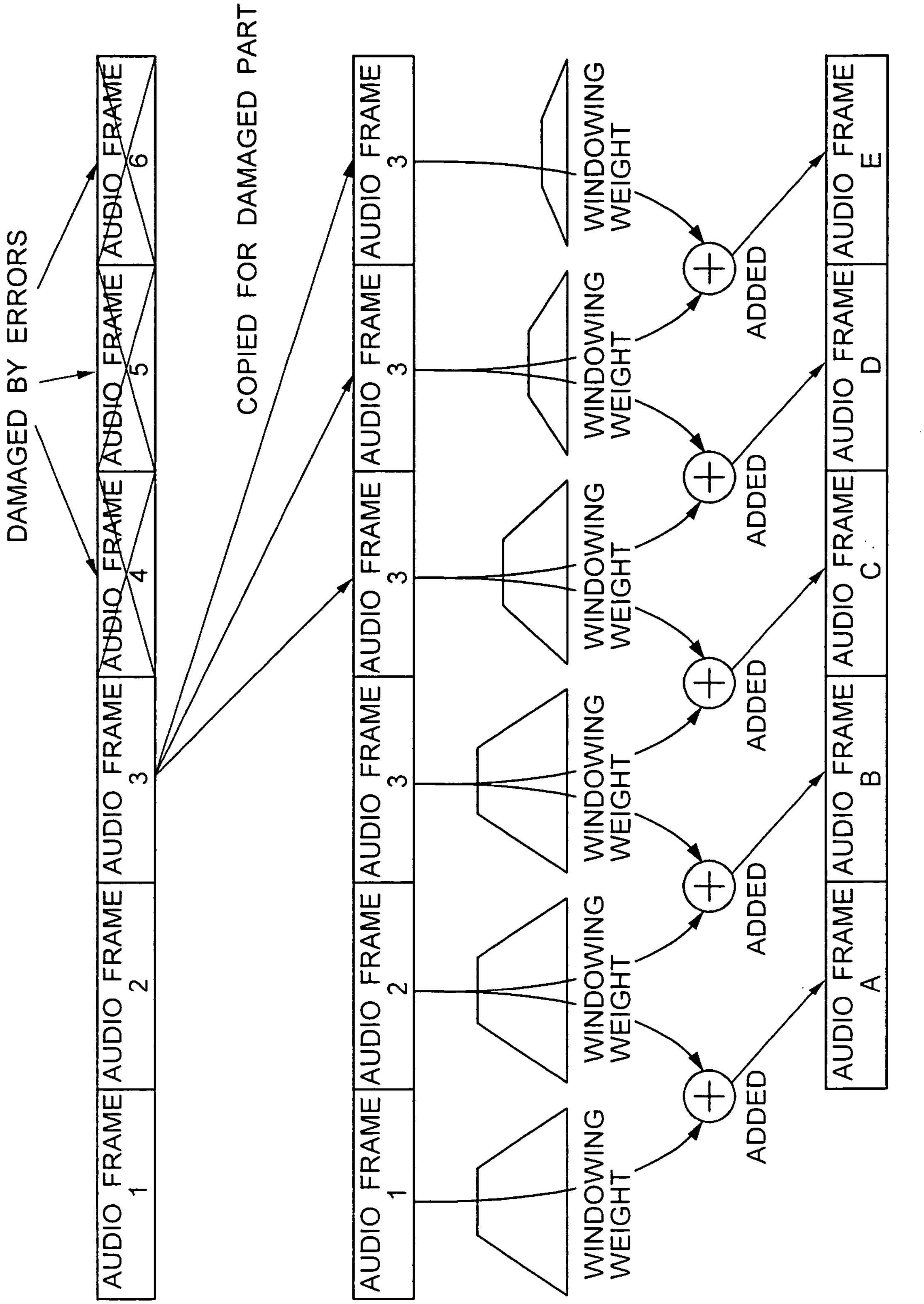
FIG. 2 is an illustration showing a first example of the contents of the error concealing method determining unit 102.

In the first method, when errors are continuously detected in the frames after correctly decoded audio frame as shown in FIG. 2, the weight of windowing processing is reduced as time passes by repeating the last audio frame which has been correctly decoded. When continuous errors at the time of decoding the audio data are detected by the error detection unit 101, the last audio frame which can be correctly decoded is copied for the damaged part and the weight of the windowing processing in between the frames is gradually attenuated. Thereby, there is no discontinuity of the outputted audio frames so that the noise due to the error cannot be perceived.

Figure 3:
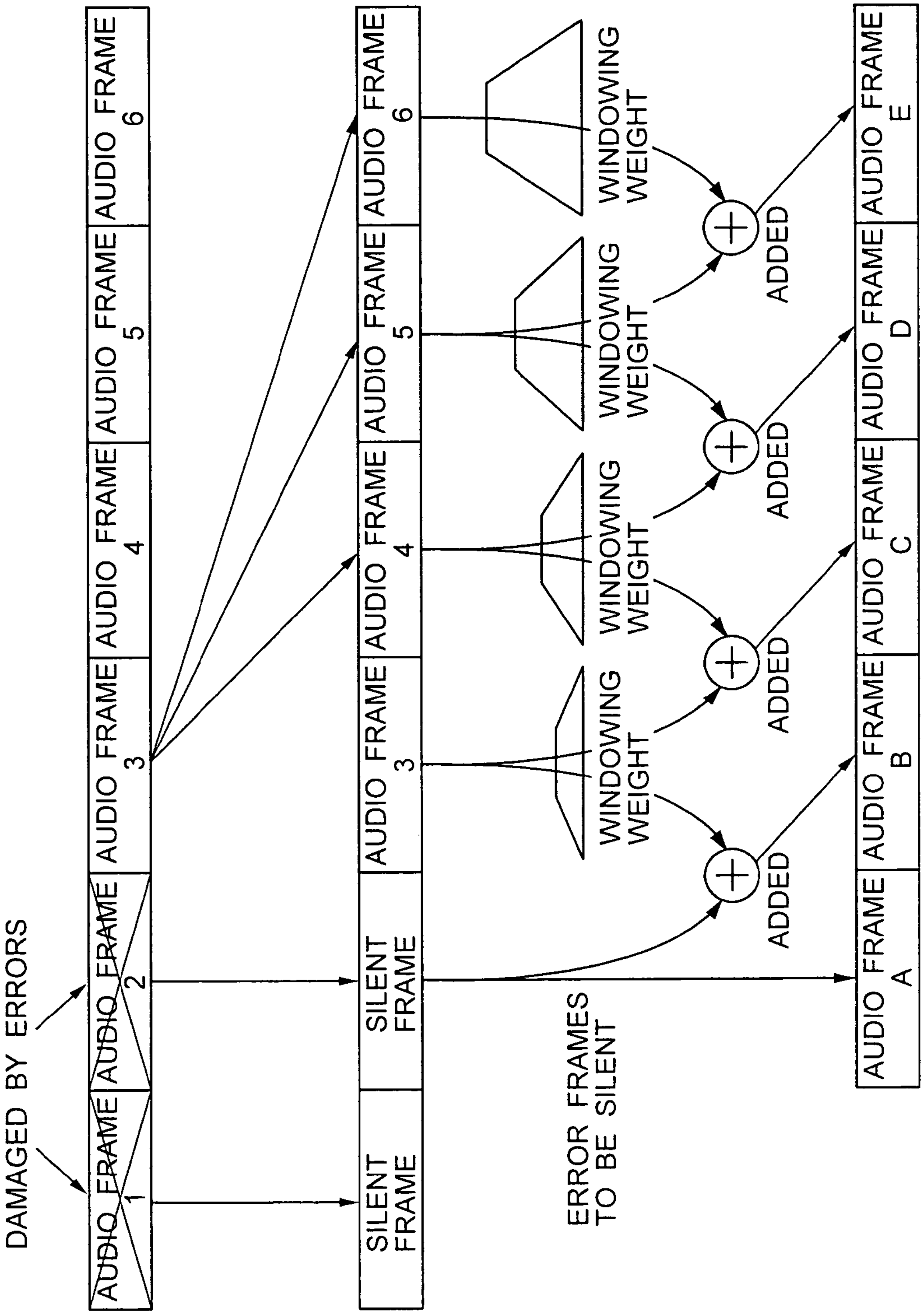
FIG. 3 is an illustration showing a second example of the contents of the error concealing method determining unit 102.

In the second method, when the audio data right after the error-detected audio data is correctly decoded as shown in FIG. 3, the weight of the windowing processing is gradually increased to be returned to the normal weight. When the error detection unit 101 detects that the error occurrence at the time of decoding the audio frame is restored and a normal decoding can be achieved, the weight of the windowing processing is gradually increased from the first audio frame which has been restored from the error to be returned to the normal weight at last. Thereby, there is no discontinuity of the outputted audio frames so that the noise due to the error cannot be perceived.

Figure 4:
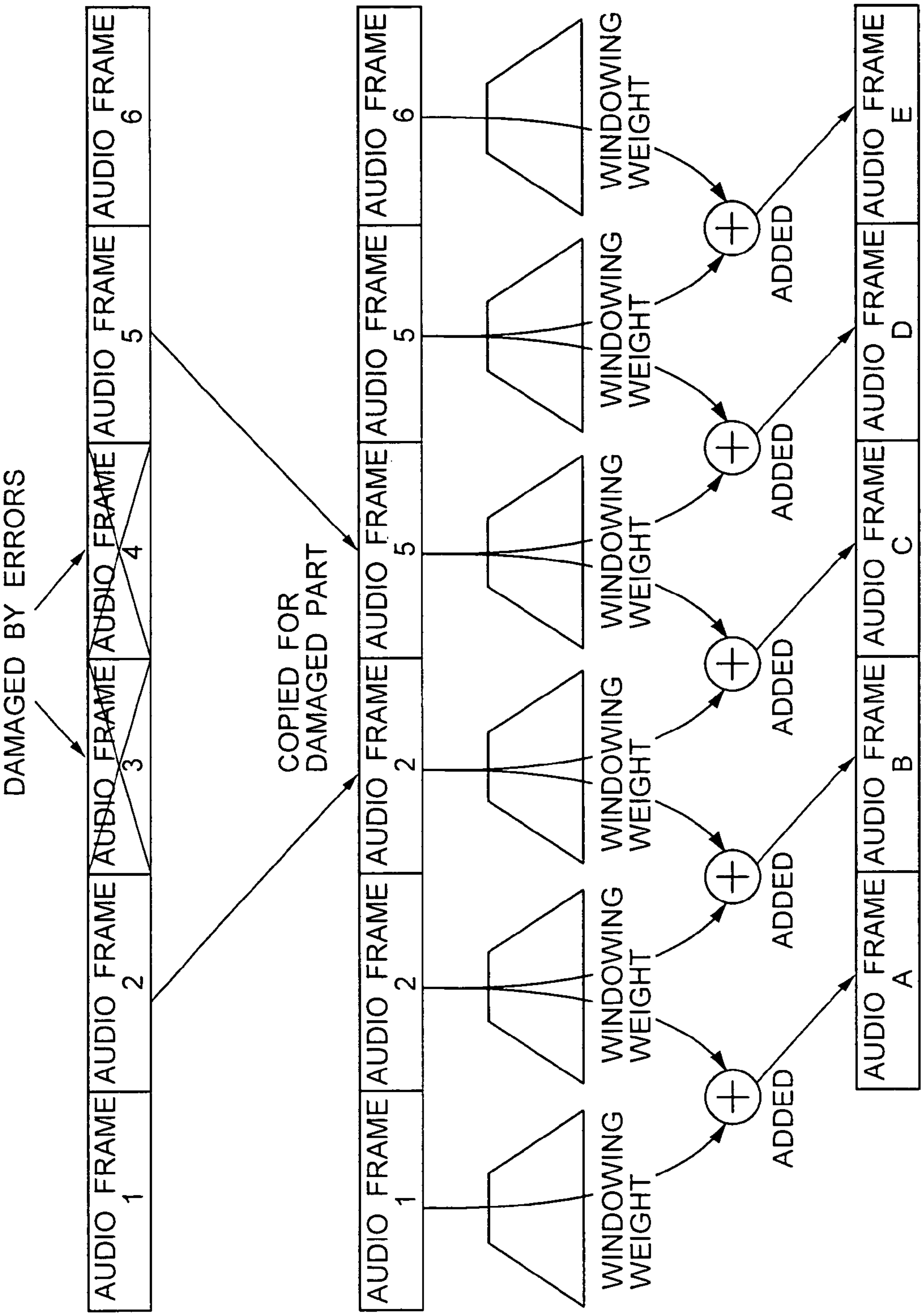
FIG. 4 is an illustration showing a third example of the contents of the error concealing method determining unit 102.

In the third method, when there is an error only in a part of the audio data which can be correctly decoded as shown in FIG. 4, a smooth transition is performed from the correctly decoded data which is the one right before the error-detected data to the correctly decoded data after the error-detected audio data by adding the weight thereto. When the error detection unit 101 detects errors in a part of the audio data, the correctly decoded audio data in the periphery of the damaged audio frame is copied, and windowing processing is performed without changing the weight of the windowing processing. Thereby, there is no discontinuity of the outputted audio frames so that the noise due to the error cannot be perceived.

The frequency-to-time converter 103 has a function of converting the audio data of frequency-domain (frequency-component) to time-domain (time-component) audio frames. As for the method for conversion using the frequency-to-time converter 103, it may use orthogonal conversion and the like such as IMDCT (Inverse Modified Discrete Cosine Transform) which is employed in many audio decoding methods.

The audio frame buffer 105 has a function of accumulating the audio frames which has been converted to be in time-component. The audio frame buffer 105 having such a function can be achieved by using, for example, a memory, a hard disk drive and the like.

The windowing processing unit 104 has functions of: taking out the audio frame, which is selected by the error concealing determining unit 102, from the frequency-to-time converter 103 and/or the audio frame buffer 105; adding weight based on the windowing weight determined by the error concealing method determining unit 102; and outputting the sound (audio frame). The windowing processing unit 104 having such functions performs processing, for example, as shown in FIGS. 2, 3 and 4. In other words, the windowing processing unit 104 takes out the present frame appointed by the error concealing processing determining unit 102 and the frame to which the windowing processing is performed from the audio frame buffer 105 and/or the frequency-to-time converter 103. Then, it outputs the audio frames by adding weight according to the designated windowing weight.

Figure 12:
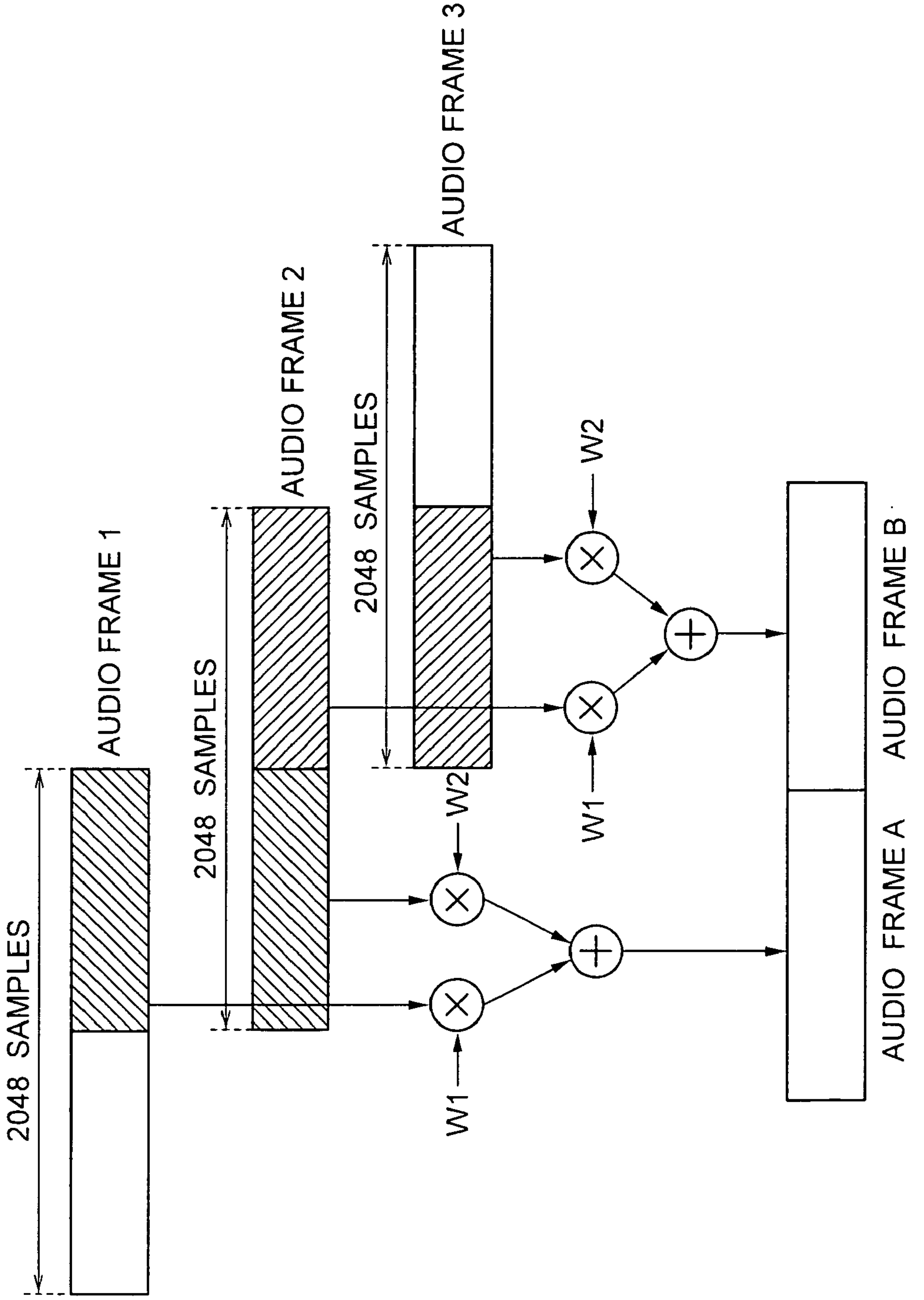
FIG. 12 is an illustration for describing weighting.

Now, weighting will be described by referring to FIG. 12. As a result of performing IMDCT, for example, audio frames 1, 2, 3 . . . made up of 2048 samples, respectively, can be obtained. The audio frame 1 and the audio frame 2 overlap each other over the 1024 samples. In the same manner, the audio frame 2 and the audio frame 3 overlap each other over the 1024 samples. In the weighting, the result of adding weight on the 1024 samples of the audio frame 1 in the second half and the result of adding weight on the 1024 samples of the audio frame 2 in the first half are summed up by each sample so as to obtain an audio frame A made up of the 1024 samples. In the same manner, the result of adding weight on the 1024 sample of the audio frame 2 in the second half and the result of adding weight on the 1024 samples of the audio frame 3 in the first half are summed up by each sample so as to obtain an audio frame B made up of the 1024 samples. In FIGS. 2, 3 and 4, the audio frames 1, 2, 3 . . . are not illustrated to overlap each other for conveniences' sake. However, in practice, they overlap each other as shown in FIG. 12.

Figure 5:
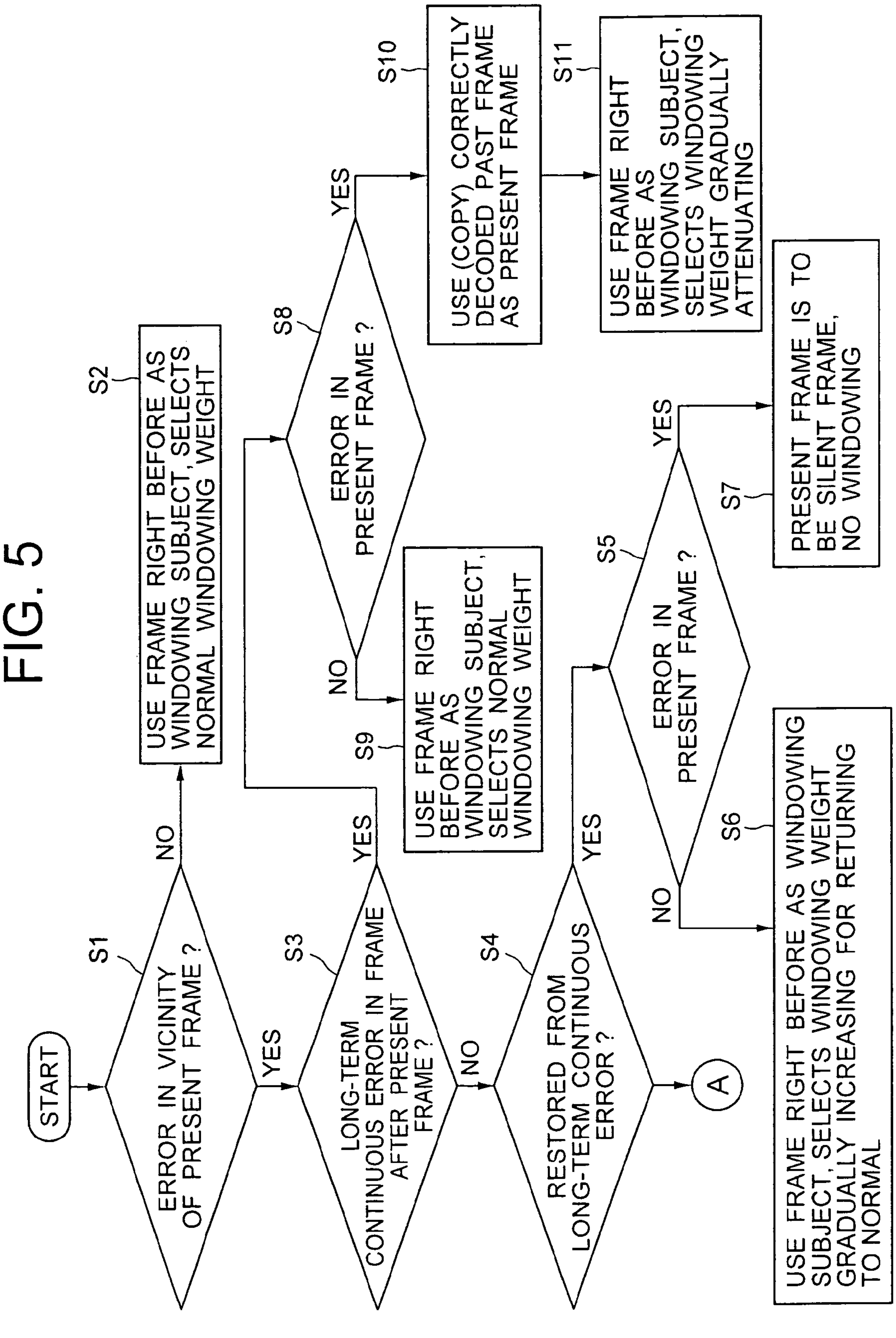
FIG. 5 is a flow chart showing a processing example of the error concealing method determining unit 102 when decoding the encoded audio data.
Figure 6:
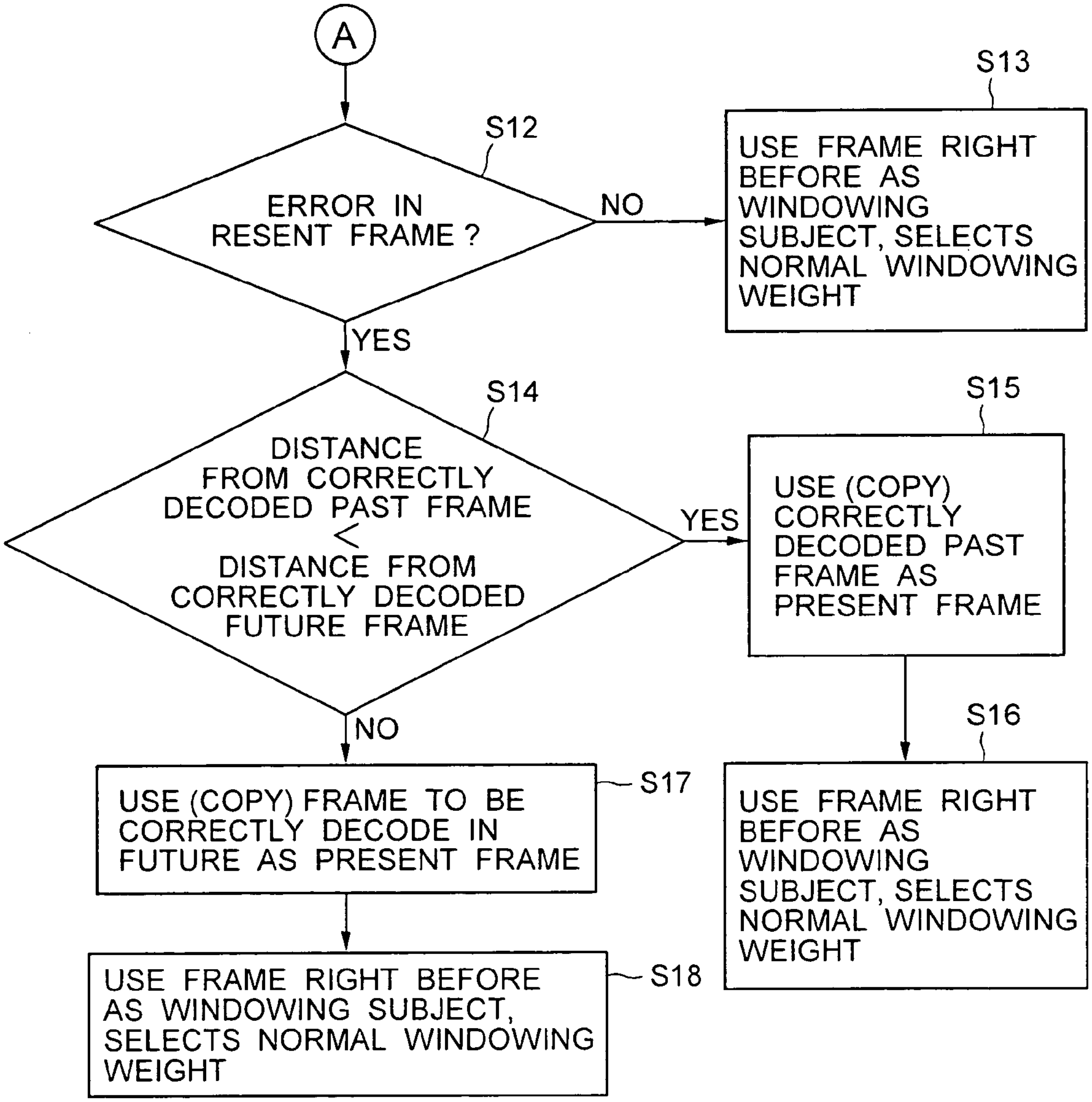
FIG. 6 is a flow chart of a processing example of the error concealing method determining unit 102 when decoding the encoded audio data.

FIGS. 5, 6 are flow charts for showing a processing example of the error concealing method determining unit 102 at the time of decoding the audio data. In the followings, operation of the embodiment will be described by referring to each drawing.

First, operation of taking out the encoded audio data which has been inputted will be described. The error detection unit 101 checks the grammar of the decoded audio data which has been inputted, error codes, and starvation of the buffer to see if there is any error occurrence and transmits the result to the error concealing method determining unit 102. At the same time, the encoded audio data is inputted to the frequency-to-time converter 103 to be converted to the time-component audio frame and outputted to the windowing processing unit 104. Also, the audio frame is accumulated in the audio frame buffer 105.

Next, determining operation of error concealing method, when there is no error in the encoded audio data, will be described. The error concealing method determining unit 102, when judging that there is no error occurrence in the vicinity of the present frame based on the error information received from the error detection unit 101 (NO in Step S1), selects the frame right before as the subject for performing windowing processing and transmits a command to the windowing processing unit 104 to perform a regular windowing processing (Step S2). The subject for windowing processing here means the other audio frames, when adding windowing weight on the present audio frame and the weight on the other audio frame.

Next, determining operation of error concealing method, when there are long-term continuous errors occurred in the encoded audio data, will be described. The error concealing method determining unit 102, when judging that there are errors in the vicinity of the present frame based on the error information received from the error detection unit 101 (YES in Step S1) and that there are long-term continuous errors in the frame after the present frame (YES in Step S3), judges whether or not there is an error in the frame to be outputted currently (Step S8).

For example, as in the case where the frame to be outputted currently is the audio frame 3 shown in FIG. 2, when judging that there is no error in the frame to be outputted currently (NO in Step 8), the error concealing method determining unit 102 transmits a command to the windowing processing unit 104 to select the frame right before as the subject for windowing processing and to perform a regular windowing processing (Step S9).

For example, as in the case where the frame to be outputted currently is the audio frames 4 to 6 shown in FIG. 2, when judging that there is an error in the frame to be outputted currently (YES in Step 8), the error concealing method determining unit 102 uses the nearest frame which has been correctly decoded as the present frame (Step S10), and transmits a command to the windowing processing unit 104 to select the frame right before as the subject for the windowing processing and to perform the windowing processing by gradually attenuating the weight (Step S11). The frame used as the present frame in the step S10 is treated as the frame right before in the step S11 when the next processing starts from Step S1. Further, by using a counter which increases by one when there is an error being continued and resets to zero when there becomes no error, it becomes possible to gradually attenuates the windowing weight every time the Step 11 is performed when there are long-term continuous errors continues.

Next, determining operation of the error concealing method determining unit 102, when the encoded audio data has restored from the long-term continuous errors, will be described. When the error concealing method determining unit 102 judges that there is an error occurrence in the vicinity of the present frame based on the error information received from the error detection unit 101 (YES in Step S1), judges that there is no long-term continuous error in the frame after the present frame (NO in Step S3) and that it has been restored from the long-term continuous errors (YES in Step S4), the error concealing method determining unit 102 judges whether or not there is an error in the frame to be outputted currently (Step S5).

For example, as in the case where the frame to be outputted currently is the audio frames 3 to 6 shown in FIG. 3, when judging that there is no error in the frame to be outputted currently (NO in Step 5), the error concealing method determining unit 102 transmits a command to the windowing processing unit 104 to select the frame right before as the subject for windowing processing and to perform the windowing processing using the windowing weight which is gradually increased to be returned to the normal weight (Step S6).

For example, as in the case where the frame to be outputted currently is the audio frame 2 shown in FIG. 3, when judging that there is an error in the frame to be outputted currently (YES in Step 5), the error concealing method determining unit 102 transmits a command to the windowing processing unit 104 to output the present frame without sound as silent data with no windowing processing being performed (Step S7). Further, by using a counter which increases by one when there is a no-error state with no error being continued and resets to zero when there is an error, it becomes possible to gradually increase the windowing weight every time the Step 6 is performed when it has been restored from the long-term continuous errors.

Next, determining operation of the error concealing method determining unit 102 in the cases which do not come under the above-described cases, that is, in the cases where there is a short-term error occurrence in the encoded audio data and it is restored right after the occurrence, will be described. When the error concealing method determining unit 102 judges that there is an error in the vicinity of the present frame based on the error information received from the error detection unit 101 (YES in Step S1), judges that there is no long-term continuous errors in the frame after the present frame (NO in Step S3), and that it has not been restored from the long-term continuous errors (NO in Step S4), the error concealing method determining unit 102 judges whether or not there is an error in the present frame (Step S12).

For example, as in the case where the frame to be outputted currently is the audio frame 2 or 5 shown in FIG. 4, when there is no error in the frame to be outputted currently (NO in Step 12), the error concealing method determining unit 102 transmits a command to the windowing processing unit 104 to select the frame right before as the subject for windowing processing and to perform a regular windowing processing (Step S13). It may seem there is no frame right before in the case of the audio frame 5 in FIG. 4, as will be described later, the audio frame 5 is treated as the present frame when processing the audio frame 4 and the frame treated as the present frame when processing the audio frame 4 is treated as the frame right before when processing the audio frame 5 as in the cases described above. Thus, as shown in FIG. 4, when the frame to be outputted currently is the audio frame 5, the audio frame 5 is treated as the present frame and the frame right before.

For example, as in the case where the frames to be outputted currently are the audio frames 3 to 4 shown in FIG. 4, when judging that there is an error in the frame to be outputted currently (YES in Step S12), the error concealing method determining unit 102 judges whether or not the distance (past distance) between the frame to be outputted currently and the nearest frame which has been correctly decoded is shorter than the distance (future distance) between the frame to be outputted at preset and the nearest frame which will be correctly decoded (Step S14).

For example, as in the case where the frame to be outputted currently is the audio frame 3 shown in FIG. 4, when the past distance is shorter than the future distance (YES in Step S14), the data concealing method determining unit 102 uses the nearest frame which has been correctly decoded as the present frame (Step S15), and transmits a command to the windowing processing unit 104 to select the frame right before as the subject for the windowing processing and to perform a regular windowing processing (Step S16).

For example, as in the case where the frames to be outputted currently are the audio frame 4 shown in FIG. 4, when the future distance is shorter than the past distance or the distances are equal (NO in Step S14), the data concealing method determining unit 102 uses the nearest frame which will be correctly decoded as the present frame (Step S17), and transmits a command to the windowing processing unit 104 to select the frame right before as the subject for the windowing processing and to perform a regular windowing processing (Step S18). The frame right before is the frame used as the present frame in the previous processing. Thus, when the frame to be outputted currently is the audio frame 4 in FIG. 4, the frame right before is the audio frame 2.

When the past distance and the future distance are equal, it may proceeds to Step S15 instead of proceeding to Step S17.

As described above, according to the embodiment, it enables to cope with the discontinued output audio data and output the sound with less unpleasant noise even in the case where there is an error in the encoded audio data.

Second Embodiment

Next, a second embodiment of the present invention will be described. In the embodiment, a better sound is achieved through performing more precise error concealing processing at the time of error occurrence by not only reducing the noise of the audio data with errors but also increasing the index for taking measures for overcoming errors.

Figure 7:
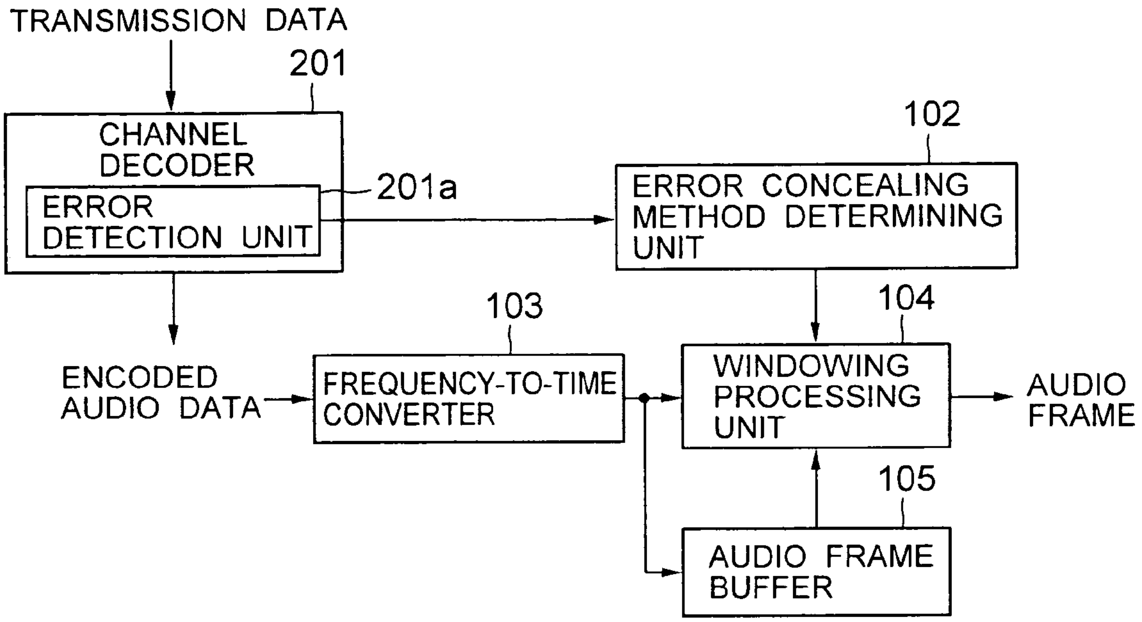
FIG. 7 is a block diagram showing a second embodiment of the present invention.

FIG. 7 is a block diagram showing the second embodiment of the present invention. The differences between the second embodiment and the first embodiment shown in FIG. 1 are that, in the second embodiment, a channel decoder 201 is added and an error detection unit 201*a* is provided instead of the error detection unit 101. The same numeral codes as the ones in FIG. 1 show the identical units.

The channel decoder 201 has a function of decoding the channel-coded data when the encoded audio data is being transmitted on the transmission paths. Specifically, it can be achieved using a decoder of Reed-Solomon code which is used, for example, for transmission of digital TV broadcast.

The error detection unit 201*a* has a function of, when decoding the channel-decoded transmission data, detecting an error when the data is damaged to an extent that is unable to be corrected and transmits the error information to the error concealing method determining unit 102.

Next, operation of the embodiment will be described. The channel decoder 201 receives the channel-decoded transmission data, decodes the channel code, and takes out the encoded audio data. At this time, the error detection unit 201*a* checks whether or not decoding of the channel code is failed and transmits the error information to the error concealing method determining unit 102. The error concealing method determining unit 102, the frequency-to-time converter 103, the windowing processing unit 104 and the audio frame buffer 105 operate in the same manner as described in the first embodiment of the present invention.

Figure 8:
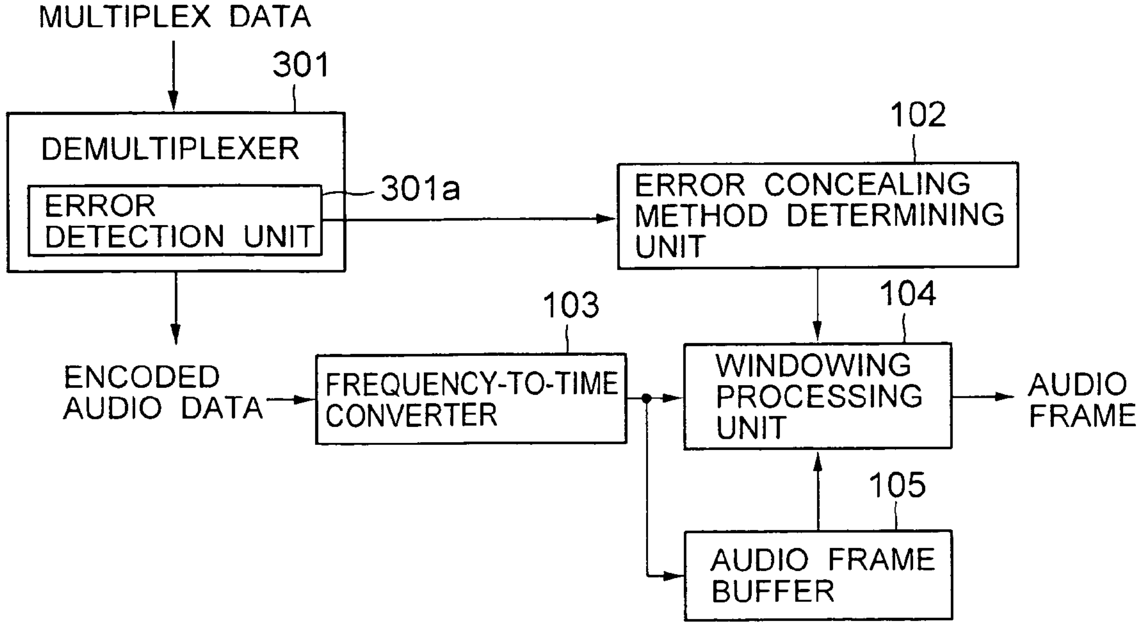
FIG. 8 is another block diagram showing the second embodiment of the present invention.

FIG. 8 is another block diagram showing the second embodiment of the present invention. The differences between the block diagram and the one shown in FIG. 1 are that, a demultiplexer 301 is added and an error detection unit 301*a* is provided instead of the error detection unit 101. The same numeral codes as the ones in FIG. 1 show the identical units.

The demultiplexer 301 has a function of demultiplexing the target audio data when the encoded audio data is multiplexed with other audio data or/and video data to be transmitted. Specifically, the demultiplexer 301 can be achieved by the demultiplexer of Transport Stream in MPEG2 System and the like.

The error detection unit 301*a* has a function of: when demultiplexing the multiplex data in which various data are multiplexed, checking the transmission error indicator and the sequence number of the data to which the target audio data belongs; detecting the error when the transmission error indicator show the existence of error or the sequence numbers are discontinuous; and transmitting the error information to the error concealing method determining unit 102.

Next, operation of the embodiment will be described. The demultiplexer 301 receives the multiplex data in which various data are multiplexed, demultiplexes the multiplex data and takes out the target encoded audio data. At this time, the error detection unit 301*a* verifies the existence of errors in the target audio data by checking the transmission error indicator and the sequence number within the multiplexing information and transmits the existence of errors in the data to the error concealing method determining unit 102. The error concealing method determining unit 102, the frequency-to-time converter 103, the windowing processing unit 104 and the audio frame buffer 105 operate in the same manner as described in the first embodiment of the present invention.

As described above, according to the embodiment, it enables to output data in which errors are concealed by detecting the errors occurred on the transmission paths and the errors in the multiplex data even in the case where there is no error correction code in the encoded audio data or it is in a structure in which errors of the grammar cannot be detected.

Third Embodiment

Figure 9:
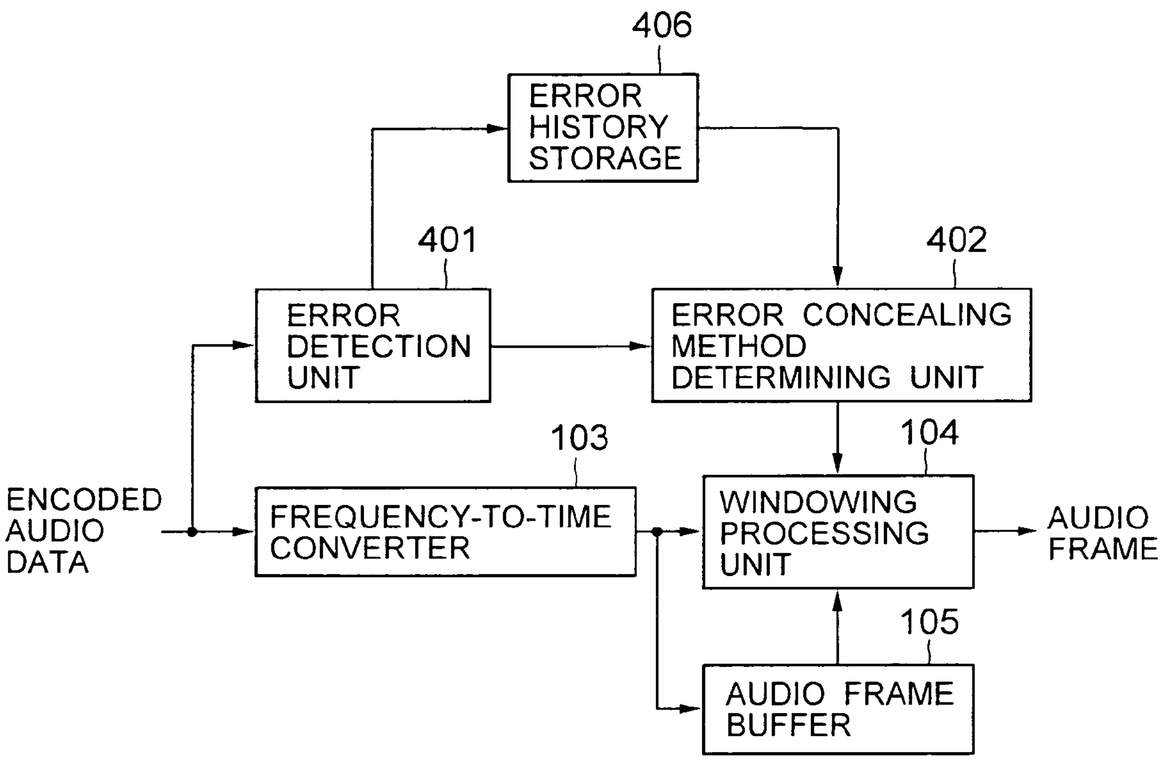
FIG. 9 is a block diagram showing a third embodiment of the present invention.

FIG. 9 is a block diagram showing a third embodiment of the present invention. The differences between the third embodiment and the first embodiment shown in FIG. 1 are that, an error history storage 406 is added, an error detection unit 401 is provided instead of the error detection unit 101, and an error concealing method determining unit 402 is provided instead of the error concealing method determining unit 102. The same numeral codes as the ones in FIG. 1 show the identical units.

The error detection unit 401 has a function of transmitting the error information of the encoded audio data to the error concealing method determining unit 402 and the error history storage 406. As for the method of detecting errors by the error detection unit 401, any methods may be used. Examples are error inspection by error code such as CRC, grammar check performed on the audio data, underflow inspection of the input buffer of the audio data and the like.

The error concealing method determining unit 402 has a function of determining the audio frame and the weight used in the windowing processing performed by the windowing processing unit 104 based on the error information of the audio data outputted from the error detection unit 401 and the error information for a past given period stored in the error history storage 406. Specifically, as the methods for determining the audio frame and the weight used for windowing operation, for example, the following three methods may be employed.

Figure 10:
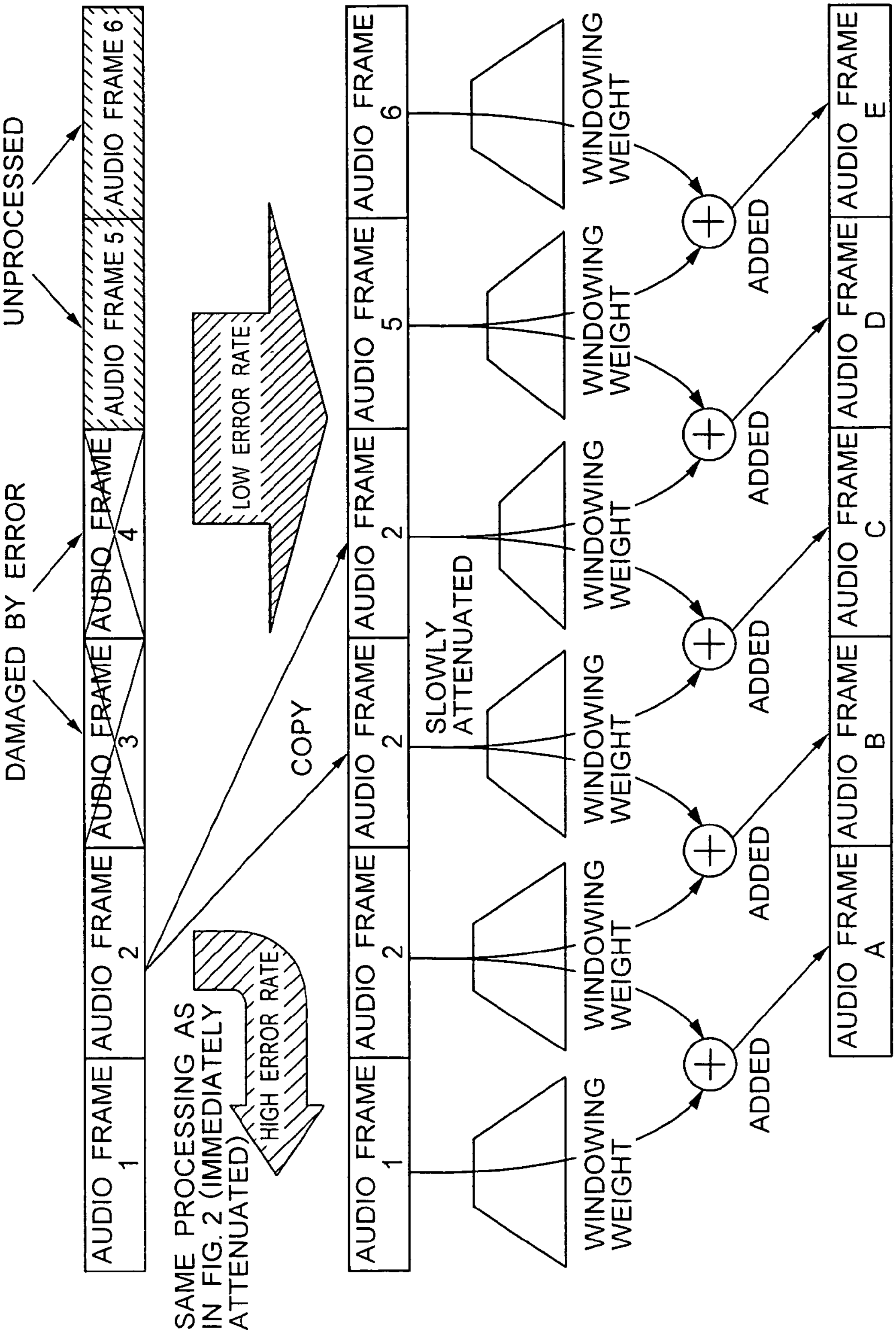
FIG. 10 is an illustration showing a first example of the contents of the error concealing method determining unit 402.

In the first methods, when errors are continuously detected in the frame after the correctly decoded frame as shown in FIG. 10, the future data error rate is predicted based on the error information for a past given period. When the predicted error rate is high, the output audio frame is immediately attenuated by the same method as the one in FIG. 2 and, when the predicted error rate is low, it is slowly attenuated on the assumption that the data is to restore from the error immediately. When the data is restored on the way, windowing processing is performed with the restored data for suppressing the deterioration of the sound to minimum. When the data is not restored, the weight is attenuated until the data can be outputted with no sound as it is.

In the second method, when errors are continuously detected in the frame after the correctly decoded frame as in the case of the first method, the predicted value of the length for which errors of the data continues is calculated based on the past error information. When the predicted value of the continuous error length is large, the output audio frame is immediately attenuated and, when the predicted value of the continuous error length is small, it is attenuated slowly on the assumption that the data is restored from the error immediately. When the data is restored on the way, windowing processing is performed with the restored data for suppressing the deterioration of the sound to minimum. When the data is not restored, the weight is attenuated until the data can be outputted with no sound.

Figure 11:
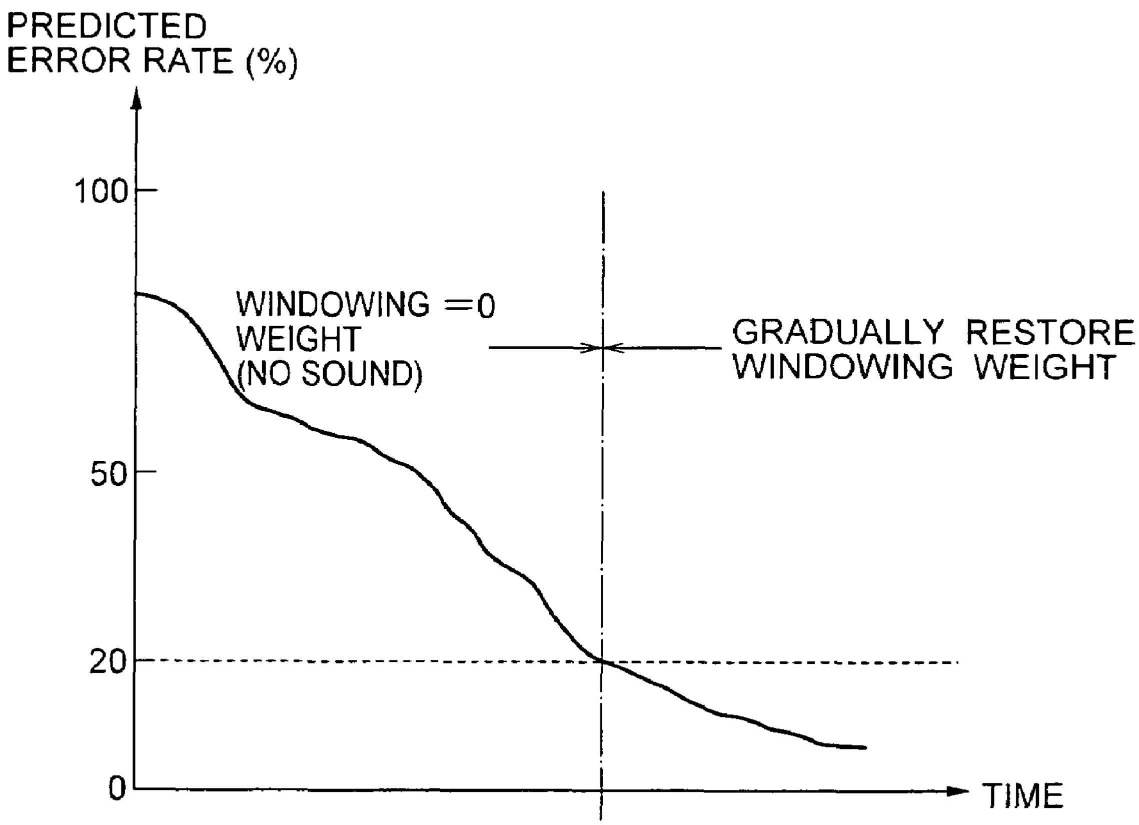
FIG. 11 is an illustration showing a third example of the contents of the error concealing method determining unit 402.

In the third methods, when the audio data is restored from the continuous errors, the future data error rate is predicted based on the past error information. When the predicted error rate is high as shown in FIG. 11, the data with no sound is outputted first and the weight is returned to normal by gradually increasing the windowing processing weight as shown in FIG. 3 when the predicted error rate decreases to an extent (20% in FIG. 11). Thereby, output of the unpleasant sound is reduced by avoiding the intermittent sound due to the number of error occurrences.

The error history storage 406 has a function of storing the error information for a past given period which is inputted from the error detection unit 401 and outputting the history of the error information upon receiving the request from the error concealing method determining unit 402. The error history storage 406 having such function can be achieved by using, for example, a memory and a hard disk drive and the like.

Next, operation of the embodiment will be described. First, the operation at the time of fetching the inputted encoded audio data will be described. The error detection unit 401 checks the grammar, error codes, starvation of the buffer and the like in regards to the inputted encoded audio data and transmits the error information to the error history storage 406. At the same time the encoded data is inputted to the frequency-to-time converter 103 to be converted to the time-component audio frame and outputted to the windowing processing unit 104. Also, the audio frame is accumulated in the audio frame buffer 105.

Now, determining operation of the error concealing method determining unit 402, when there are continuous errors occurred in the encoded audio data, will be described. The error concealing method determining unit 402 calculates the predicted value of the future error rate based on the error information received from the error detection unit 401 and the past error information accumulated in the error history storage 406. As for the specific methods for calculation, for example, the following expression can be used.

(Predicted Error Rate)=(Number of Audio Frames with Error within Past 1 sec.)/(Number of Audio Frames Processed within Past 1 sec.)

When the predicted error rate is high, it is judged that the data is not to restore from the error immediately and a command is transmitted to the windowing processing unit 104 in the same manner as the one shown in FIG. 2 to reduce the windowing weight to immediately attenuate the output sound. On the other hand, when the predicted error rate is low, it is judged that the data is to restore from the error immediately, and the windowing weight is slowly reduced. When the data is restored, the windowing processing is performed with the normal audio frame right after to suppress the deterioration of the sound to minimum using the method as shown in FIG. 10. When the data does not restore from the error, the windowing weight is slowly reduced and the processing is continued until it becomes silent.

The determining operation of another error concealing method, when there are continuous errors occurred in the encoded audio data, will be described. The error concealing method determining unit 402 calculates the predicted value of the continuous error length based on the error information received from the error detection unit 401 and the past error information accumulated in the error history storage 406. As for the specific methods for calculation, for example, the following expression can be used.

(Predicted Value of Continuous Error Length)=(Mean Value of Error Lengths in Past 10 Times)

When the predicted value of the continuous error lengths is high, it is judged that the data is not to restore from the error immediately and a command is transmitted to the windowing processing unit 104 in the same manner as the one shown in FIG. 2 to reduce the windowing processing to immediately attenuate the output sound. On the other hand, when the predicted value of the continuous error lengths is low, it is judged that the data is to restore from the error immediately, and speed of reducing the windowing weight is slow down. When the data is restored, the windowing processing is performed with the normal audio frame right after to suppress the deterioration of the sound to minimum using the method as shown in FIG. 10. When the data does not restore from the error, the windowing weight is slowly reduced as is and the processing is continued until it becomes silent.

Determining operation of the error concealing method, when the encoded data is restored from the continuous errors, will be described. The error concealing method determining unit 402 calculates the predicted value of the future error rate based on the error information received from the error detection unit 401 and the past error information accumulated in the error history storage 406. As for the specific methods for calculation, for example, the expression described above can be used. When the predicted error rate is high, it is judged that the data is again to be in the state with errors and a command is transmitted to the windowing processing unit 104 to maintain the windowing weight to be zero to continue the output with no sound. On the other hand, when the predicted error rate is low, it is judged that the data is to restore from the error, and a command is transmitted to the windowing processing unit 104 to slowly returns to the normal windowing weight in the same manner as the one shown in FIG. 3.

Now, operation of the windowing processing will be described. The windowing processing unit 104 takes out the present frame and the subject frame for the windowing processing indicated by the error concealing method determining unit 402 from the frequency-to-time converter 103, adds the weight according to the indicated windowing weight, and outputs the audio frame.

As described above, according to the embodiments, it enables to conceal the errors by predicting the future error state even in the case where there are errors occurred in the encoded audio data. Thus, the output of the unpleasant sound can be further reduced.

As described above, the audio decoder of the present invention can avoid discontinuity by adjusting the weight of the windowing processing through using other frame in place for the frame with errors even in the case where there are errors occurred in the audio data. Thus, it has an effect to reduce the output of the unpleasant noise by a small amount of operation.

Further, the audio decoder of the present invention can use the error information in terms of the channel coding and multiplexing so that it can achieve the error concealing processing with fewer mistakes.

Furthermore, the audio decoder of the present invention enables to perform more precise error concealing processing by predicting the future error occurrence state based on the past error information at the time of error occurrence.

What is claimed is:

1. An audio decoder for decoding encoded audio data, comprising:

an error detection device for detecting errors of encoded audio data;

an error concealing method determining device for determining an audio frame and weight of window function which are used for concealing the errors based on error information detected by the error detection device;

a frequency-to-time converter for converting audio data of frequency components to time-component audio frame;

an audio frame buffer for accumulating time-component audio frame outputted by the frequency-to-time converter; and a windowing processing device for weighting the time-component audio frame outputted by the frequency-to-time converter and/or the audio frame accumulated in the audio frame buffer according to the weight of window function determined by the error concealing method determining device.

2. The audio decoder as claimed in claim 1, wherein the windowing processing device, when there are continuous errors occurred, continuously outputs an audio frame which is the one before the continuous error occurrence while attenuating the amplitude.

3. The audio decoder as claimed in claim 1, wherein the windowing processing device, when restored from the continuous errors, outputs the restored audio frame while increasing the amplitude.

4. The audio decoder as claimed in claim 1, wherein, when there are short-term errors occurred, the windowing processing device outputs an audio frame which is the one before the short-term error occurrence in a first half of the short-term errors and outputs an audio frame which is the one after the short-term error occurrence in a second half of the short-term errors.

5. The audio decoder as claimed in claim 1, wherein the error detection device is included in a channel decoder having a function of decoding data to which transmission-line encoding is performed.

6. The audio decoder as claimed in claim 1, wherein the error detection device is included in a demultiplexer having a function of demultiplexing data stream obtained by multiplexing audio data.

7. The audio decoder as claimed in claim 1, wherein the error detection device further comprises an error history storage for storing the history of error information detected by the error detection device, and the error concealing method determining device determines the audio frame and weight of window function which are used for concealing errors based on the error information detected by the error detection device and the history of the error information stored in the error history storage.

8. The audio decoder as claimed in claim 7, wherein the error concealing method determining device determines the processing manner based on error occurrence rate of the past which is stored in the error history storage and the error information detected by the error detection device.

9. The audio decoder as claimed in claim 7, wherein the error concealing method determining device determines the processing manner based on the number of continuously-missed-data occurred in the past which is stored in the error history storage and the error information detected by the error detection device.

10. The audio decoder as claimed in claim 7, wherein, when there is an error occurrence, the windowing processing device, in the case where the error rate is a first error rate, continuously outputs the audio frame which is the one before the error occurrence while attenuating the amplitude by a first attenuation rate and, in the case where the error rate is a second error rate which is lower than the first error rate, continuously outputs the audio frame which is the one before the error occurrence while attenuating the amplitude by a second attenuation rate which is lower than the first attenuation rate.

11. The audio decoder as claimed in claim 7, wherein, when recovered from the continuous errors, the windowing processing device performs output without sound when a predicted error rate is over a threshold value and outputs the audio frame while increasing the amplitude when the predicted error rate is below the threshold value.

12. An audio decoding method, comprising:

an error detection step for detecting errors of encoded audio data;

an error concealing method determining step for determining an audio frame and weight of window function which are used for concealing the errors based on error information detected by the error detection step;

a frequency-to-time converting step for converting audio data of frequency components to time-component audio frame;

an audio frame buffering step for accumulating the time-component audio frame outputted by the frequency-to-time converting step; and a windowing processing step for weighting the time-component audio frame outputted by the frequency-to-time converting step and/or the audio frame accumulated in the audio frame buffer according to the weight of window function determined by the error concealing method determining device.

13. The audio decoding method as claimed in claim 12, wherein in the windowing processing step, when there are continuous errors occurred, an audio frame which is the one before the continuous error occurrence is continuously outputted while attenuating the amplitude.

14. The audio decoding method as claimed in claim 12, wherein in the windowing processing step, when restored from the errors, the restored audio frame is outputted while increasing the amplitude.

15. The audio decoding method as claimed in claim 12, wherein, when there are short-term errors occurred, in the windowing processing step, an audio frame which is the one before the short-term error occurrence is outputted in a first half of the short-term errors and the audio frame which is the one after the short-term error occurrence is outputted in a second half of the short-term errors.

16. The audio decoding method as claimed in claim 12, wherein the error detection step further includes an error history storing step for storing the history of error information detected by the error detection step, and in the error concealing method determining step, the audio frame and weight of window function which are used for concealing errors are determined based on the error information detected by the error detection step and the history of the error information stored in the error history storing step.

17. The audio decoding device as claimed in claim 16, wherein in the error concealing method determining step, the processing manner is determined based on error occurrence rate of the past which is stored in the error history storing step and the error information detected by the error detection step.

18. The audio decoding method as claimed in claim 16, wherein in the error concealing method determining step, the processing manner is determined based on the number of continuously-missed-data occurred in the past which is stored in the error history storing step and the error information detected by the error detection step.

19. The audio decoding method as claimed in claim 16, wherein, when there is an error occurrence, in the windowing processing step, in the case where the error rate is a first error rate, the audio frame which is the one before the error occurrence is continuously outputted while attenuating the amplitude by a first attenuation rate and, in the case where the error rate is a second error rate which is lower than the first error rate, the audio frame which is the one before the error occurrence is continuously outputted while attenuating the amplitude by a second attenuation rate which is lower than the first attenuation rate.

20. The audio decoding method as claimed in claim 16, wherein, when restored from the continuous error, in the windowing processing step, output is performed without sound when a predicted error rate is over the threshold value and the audio frame is outputted while increasing the amplitude when the predicted error rate is below the threshold value.

* * * * *